United States Patent
Hwang et al.

(10) Patent No.: US 11,450,366 B2
(45) Date of Patent: Sep. 20, 2022

(54) DIVIDING CIRCUIT SYSTEM AND SEMICONDUCTOR MEMORY SYSTEM INCLUDING THEREOF

(71) Applicant: SK hynix Inc., Gyeonggi-do (KR)

(72) Inventors: Jin Ha Hwang, Gyeonggi-do (KR); Kwang Soon Kim, Gyeonggi-do (KR); Dae Ho Yang, Gyeonggi-do (KR); Yo Han Jeong, Gyeonggi-do (KR); Jun Sun Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/331,918

(22) Filed: May 27, 2021

(65) Prior Publication Data
US 2022/0270656 A1 Aug. 25, 2022

(30) Foreign Application Priority Data
Feb. 19, 2021 (KR) .......................... 10-2021-0022300

(51) Int. Cl.
*G11C 7/22* (2006.01)
*G11C 7/10* (2006.01)

(52) U.S. Cl.
CPC .............. *G11C 7/222* (2013.01); *G11C 7/109* (2013.01); *G11C 7/1063* (2013.01)

(58) Field of Classification Search
CPC ........................................................ G11C 7/22
USPC .................................................. 365/189.011
See application file for complete search history.

(56) References Cited

U.S. PATENT DOCUMENTS

| | | | | |
|---|---|---|---|---|
| 2006/0041802 A1* | 2/2006 | Grise | ............. | G01R 31/318555 714/724 |
| 2008/0298142 A1* | 12/2008 | Chen | ...................... | G11C 7/227 365/194 |
| 2011/0214003 A1* | 9/2011 | Nara | ........................ | G06F 1/08 713/400 |
| 2014/0368246 A1* | 12/2014 | Kim | ..................... | H03K 3/0372 327/202 |
| 2015/0042388 A1* | 2/2015 | Song | ..................... | H03K 5/135 327/153 |
| 2016/0189586 A1* | 6/2016 | Zou | ..................... | G09G 3/3266 345/213 |
| 2019/0036533 A1* | 1/2019 | Yanagihara | ............ | H03K 23/64 |

FOREIGN PATENT DOCUMENTS

KR 10-1944964 B1 2/2019

* cited by examiner

*Primary Examiner* — Muna A Techane
(74) *Attorney, Agent, or Firm* — IP & T Group LLP

(57) ABSTRACT

A dividing circuit system includes a first dividing circuit and a second dividing circuit. The first dividing circuit performs a reset operation based on a reset control signal and generates second and fourth divided clock signals. The second dividing circuit performs a reset operation based on the reset control signal and generates first and third divided clock signals.

20 Claims, 5 Drawing Sheets

DIVIDING CIRCUIT SYSTEM AND SEMICONDUCTOR MEMORY SYSTEM INCLUDING THEREOF

CROSS-REFERENCES TO RELATED APPLICATION

The present application claims priority under 35 U.S.C. § 119(a) to Korean application number 10-2021-0022300, filed on Feb. 19, 2021, in the Korean Intellectual Property Office, which is incorporated herein by reference in its entirety as set forth in full.

BACKGROUND

1. Technical Field

Various embodiments generally relate to a dividing circuit system and a semiconductor memory system including the same, and, more particularly, to a dividing circuit system capable of generating a divided clock signal by dividing a clock signal and a semiconductor memory system including the same.

2. Related Art

In general, an integrated circuit such as a semiconductor apparatus and a semiconductor memory apparatus performs various operations based on a clock signal provided from an external. The integrated circuit may perform an operation faster as a frequency of the clock signal provided from an external becomes greater. Therefore, the frequency of the clock signal provided to the integrated circuit becomes higher nowadays.

However, there are several concerns when the integrated circuit receives the external clock signal having the higher frequency to internally utilize the external clock signal. First, the integrated circuit consumes a large amount of power to utilize the external clock signal having the higher frequency. Secondly, it is hard for the integrated circuit to precisely receive and utilize the external clock signal having the higher frequency. Thirdly, the external clock signal having the higher frequency is vulnerable to a noise. Therefore, it is a great burden for the integrated circuit to utilize the external clock signal having the higher frequency.

In order to address these concerns, the integrated circuit divides the external clock signal having the higher frequency to internally utilize a clock signal divided from the external clock signal. The clock signal is divided by a dividing circuit. The dividing circuit may receive an external clock of a high frequency to generate a clock signal divided from the external clock and having a lower frequency.

However, it is hard for a prior art dividing circuit to cope with the external clock signal, of which a frequency becomes high. Further, since a prior art dividing circuit performs a reset operation at a reset timing, which is synchronized to an internal clock signal, it is impossible for the prior art dividing circuit to generate a divided clock signal having a target phase.

SUMMARY

In accordance with an embodiment of the present disclosure, a dividing circuit system may include a first dividing circuit and a second dividing circuit. The first dividing circuit may be configured to perform a reset operation based on a reset control signal and configured to generate a second divided clock signal and a fourth divided clock signal, which are divided from a positive clock signal, and which are based on the positive clock signal, a first divided clock signal and a third divided clock signal. The second dividing circuit may be configured to perform a reset operation based on the reset control signal and configured to generate the first divided clock signal and the third divided clock signal, which are divided from a negative clock signal, and which are based on the negative clock signal, the second divided clock signal and the fourth divided clock signal.

In accordance with an embodiment of the present disclosure, a semiconductor memory system may include a controller and a semiconductor memory apparatus. The controller may be configured to provide data and an external command signal corresponding to read and write operations. The semiconductor memory apparatus may include a command generating circuit, a first dividing circuit and a second dividing circuit. The command generating circuit may be configured to generate an internal command signal based on the external command signal. The first dividing circuit may be configured to perform a reset operation based on the internal command signal and configured to generate a second divided clock signal and a fourth divided clock signal, which are divided from a positive clock signal, and which are based on the positive clock signal, a first divided clock signal and a third divided clock signal. The second dividing circuit may be configured to perform a reset operation based on the internal command signal and configured to generate the first divided clock signal and the third divided clock signal, which are divided from a negative clock signal, and which are based on the negative clock signal, the second divided clock signal and the fourth divided clock signal.

DETAILED DESCRIPTION

Figure 1:
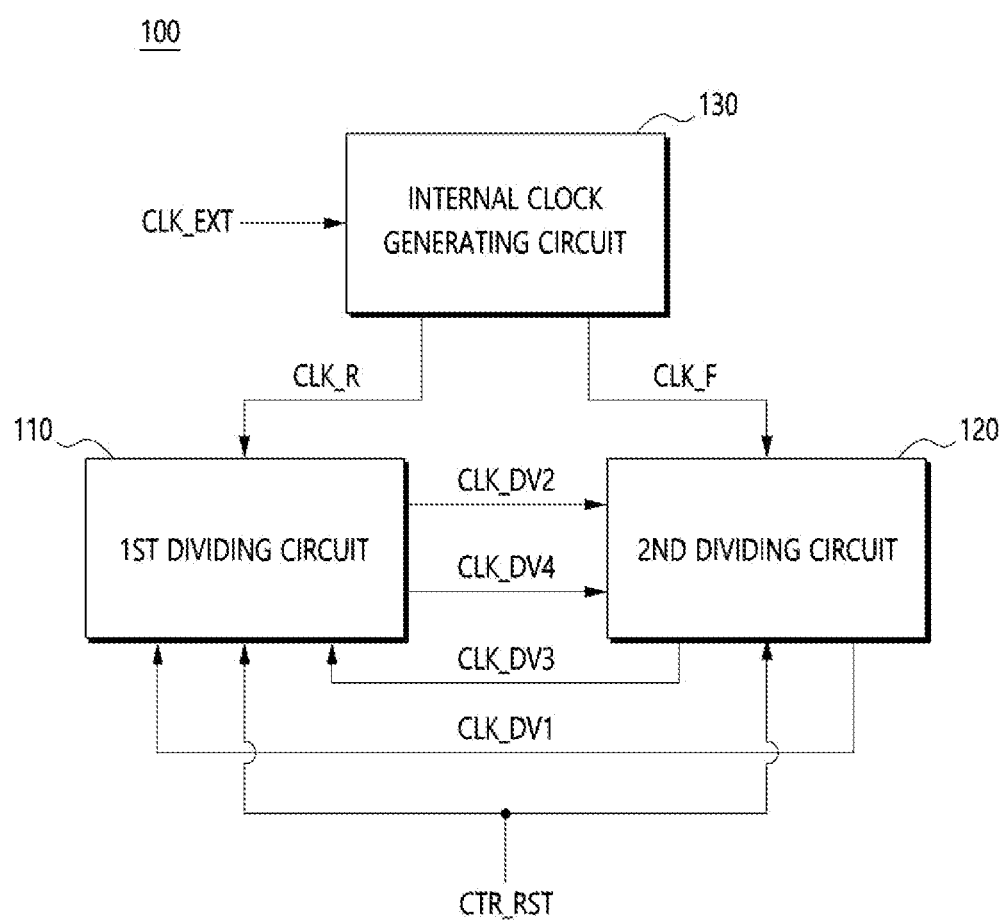
FIG. 1 is a block diagram illustrating a configuration of a dividing circuit system in accordance with an embodiment.

The present description of the present disclosure provides structural and functional details directed to various embodiments. The scope of the invention, however, is not limited to or by any of the disclosed embodiments nor to any particular detail provided herein. That is, those skilled in the art will understand in view of the present disclosure that any embodiment may be modified in various ways and may have various forms. Accordingly, the invention encompasses all such variations that fall within the scope of the claims including their equivalents. Furthermore, a specific embodiment does not necessarily include all stated objects or effects nor include only such objects and effects. Accordingly, the scope of the invention is not limited thereby.

Throughout the specification, reference to "an embodiment" or the like is not necessarily to only one embodiment, and different references to any such phrase is not necessarily to the same embodiment(s). The term "embodiments" when used herein does not necessarily refer to all embodiments.

Terms, such as "first" and "second", are used to distinguish one element from another element that otherwise have the same or similar names. A first element in one instance may be named a second element in another instance without indicating any substantive change in the element itself.

The singular is intended to include the plural, unless clearly expressed otherwise or it is clear from the context that only one is intended. Open-ended terms such as "include" or "have" should be understood as indicating the existence of stated characteristics, numbers, steps, operations, elements, parts, or combination thereof, but not excluding the possibility that one or more other characteristics, numbers, steps, operations, elements, parts, or combination thereof are present or may be added.

In each of steps, symbols (e.g., a, b, and c) are used for convenience of a description, not necessarily to indicate any particular order of steps or operations. Consistent with the teachings herein, steps/operations may be performed in any suitable order, unless a specific order is clearly described or such order is indicated by the context. In some cases, two or more steps/operations may be performed substantially at the same time.

All the terms used herein, including technological or scientific terms, have the same meanings as typically understood by those skilled in the art, unless otherwise defined. Terms defined in commonly used dictionaries should be construed in the context of the related technology and should not be construed as ideal or in an excessively formal way, unless clearly defined in the application.

In accordance with an embodiment of the present disclosure, provided is a dividing circuit system capable of performing an asynchronous reset operation and a semiconductor memory system including the same.

In accordance with an embodiment of the present disclosure, a stable dividing operation is obtained with an external clock signal having a high frequency.

FIG. 1 is a block diagram illustrating a configuration of a dividing circuit system 100 in accordance with an embodiment.

Referring to FIG. 1, the dividing circuit system 100 may include a first dividing circuit 110 and a second dividing circuit 120.

The first dividing circuit 110 may be configured to perform a reset operation based on a reset control signal CTR_RST. The first dividing circuit 110 may be configured to generate a second divided clock signal CLK_DV2 and a fourth divided clock signal CLK_DV4, which are divided from a positive clock signal CLK_R, and which are based on the positive clock signal CLK_R, a first divided clock signal CLK_DV1 and a third divided clock signal CLK_DV3. The reset control signal CTR_RST may be a signal, which is asynchronously generated, and for example, may include a chip enable signal defined in a specification of a semiconductor apparatus. The positive clock signal CLK_R may be a signal, which is generated from an internal clock generating circuit 130 that will be described later. The internal clock generating circuit 130 will be described below again. The second divided clock signal CLK_DV2 and the fourth divided clock signal CLK_DV4 may be signals, which are divided from the positive clock signal CLK_R, and may have different phases from each other.

The second dividing circuit 120 may be configured to perform the reset operation based on the reset control signal CTR_RST. The second dividing circuit 120 may be configured to generate the first divided clock signal CLK_DV1 and the third divided clock signal CLK_DV3, which are divided from a negative clock signal CLK_F, and which are based on the negative clock signal CLK_F, the second divided clock signal CLK_DV2 and the fourth divided clock signal CLK_DV4. The first divided clock signal CLK_DV1 and the third divided clock signal CLK_DV3 may be signals, which are divided from the negative clock signal CLK_F, and may have different phases from each other. As will be described with reference to FIG. 4, the first to fourth divided clock signals CLK_DV1, CLK_DV2, CLK_DV3 and CLK_DV4 may have different phases from one another.

In accordance with an embodiment of the present disclosure, the dividing circuit system 100 may generate the first to fourth divided clock signals CLK_DV1, CLK_DV2, CLK_DV3 and CLK_DV4, which have different phases from one another, through a reset operation and a dividing operation. The dividing circuit system 100 may perform the reset operation by utilizing the reset control signal CTR_RST, which is asynchronously generated.

In accordance with an embodiment of the present disclosure, the dividing circuit system 100 may include the internal clock generating circuit 130. The internal clock generating circuit 130 may be configured to receive an external clock signal CLK_EXT in order to generate the positive clock signal CLK_R and the negative clock signal CLK_F. The positive clock signal CLK_R may correspond to a rising edge of the external clock signal CLK_EXT and the negative clock signal CLK_F may correspond to a falling edge of the external clock signal CLK_EXT.

In accordance with an embodiment of the present disclosure, the dividing circuit system 100 may receive the external clock signal CLK_EXT in order to generate, through a reset operation and a dividing operation, the first to fourth divided clock signals CLK_DV1, CLK_DV2, CLK_DV3 and CLK_DV4 having different phases from one another.

Figure 2:
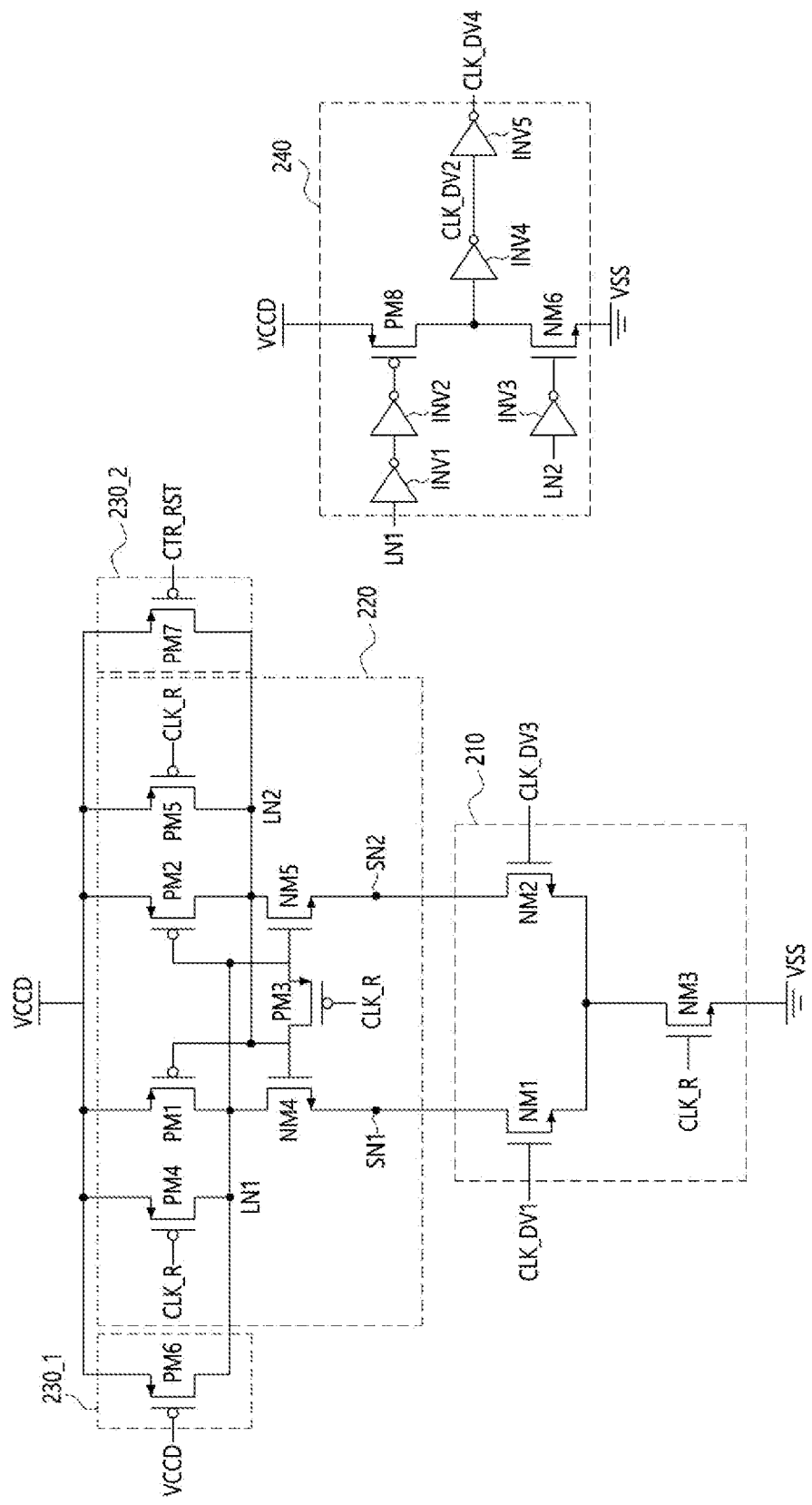
FIG. 2 is a circuit diagram illustrating a configuration of a first dividing circuit illustrated in FIG. 1.

FIG. 2 is a circuit diagram illustrating a configuration of the first dividing circuit 110 illustrated in FIG. 1.

Referring to FIG. 2, the first dividing circuit 110 may include a signal input circuit 210, a node amplifying circuit 220, a node reset circuit 230_1 and 230_2 and a signal output circuit 240.

The signal input circuit 210 may be configured to receive the first divided clock signal CLK_DV1 and the third divided clock signal CLK_DV3 and load the first divided clock signal CLK_DV1 and the third divided clock signal CLK_DV3 respectively to setup nodes SN1 and SN2, respectively, based on the positive clock signal CLK_R. The setup nodes SN1 and SN2 may include a first setup node SN1 and a second setup node SN2. The signal input circuit 210 may include first to third NMOS transistors NM1, NM2 and NM3.

The first NMOS transistor NM1 may be coupled between the first setup node SN1 and the third NMOS transistor NM3 through its drain and source and may receive the first divided clock signal CLK_DV1 at its gate. The second NMOS transistor NM2 may be coupled between the second setup node SN2 and the third NMOS transistor NM3 through its drain and source and may receive the third divided clock signal CLK_DV3 at its gate. The third NMOS transistor NM3 may be commonly coupled to the sources of the first NMOS transistor NM1 and the second NMOS transistor NM2 and may be coupled to a power node, to which a ground power source VSS is applied, through its drain and source. The third NMOS transistor NM3 may receive the positive clock signal CLK_R at its gate.

An operation of the signal input circuit 210 may be as follows.

When a level of the positive clock signal CLK_R becomes a logic high, the third NMOS transistor NM3 may be turned on. When a level of the first divided clock signal CLK_DV1 becomes a logic high, the first NMOS transistor NM1 may be turned on and a voltage level of the first setup node SN1 may be lowered. That is, the first setup node SN1 may be loaded to have a voltage level corresponding to the first divided clock signal CLK_DV1. When a level of the third divided clock signal CLK_DV3 becomes a logic high, the second NMOS transistor NM2 may be turned on and a voltage level of the second setup node SN2 may be lowered. That is, the second setup node SN2 may be loaded to have a voltage level corresponding to the third divided clock signal CLK_DV3.

With such configuration, the signal input circuit 210 may load the first divided clock signal CLK_DV1 to the first setup node SN1 and may load the third divided clock signal CLK_DV3 to the second setup node SN2, based on the positive clock signal CLK_R.

The node amplifying circuit 220 may be configured to sense and amplify the first divided clock signal CLK_DV1 loaded to the first setup node SN1 and the third divided clock signal CLK_DV3 loaded to the second setup node SN2 based on the positive clock signal CLK_R. The node amplifying circuit 220 may include first to fifth PMOS transistors PM1, PM2, PM3, PM4 and PM5, and fourth and fifth NMOS transistors NM4 and NM5.

The first PMOS transistor PM1 and the fourth NMOS transistor NM4 may be serially coupled between a power node, to which a supply power source VCCD is applied, and the first setup node SN1. The first PMOS transistor PM1 and the fourth NMOS transistor NM4 may be interconnected at a first latching node LN1. The second PMOS transistor PM2 and the fifth NMOS transistor NM5 may be serially coupled between the power node, to which the supply power source VCCD is applied, and the second setup node SN2. The second PMOS transistor PM2 and the fifth NMOS transistor NM5 may be interconnected at a second latching node LN2. Gates of the first PMOS transistor PM1 and the second PMOS transistor PM2 and the fourth NMOS transistor NM4 and the fifth NMOS transistor NM5 may be connected in the cross-coupled type. The third PMOS transistor PM3 may be coupled between the gates of the fourth NMOS transistor NM4 and the fifth NMOS transistor NM5, through its drain and source. The fourth PMOS transistor PM4 may be coupled between the power node, to which the supply power source VCCD is applied, and the first latching node LN1, through its source and drain, and may receive the positive clock signal CLK_R at its gate. The fifth PMOS transistor PM5 may be coupled between the power node, to which the supply power source VCCD is applied, and the second latching node LN2, through its source and drain, and may receive the positive clock signal CLK_R at its gate.

With such configuration, the node amplifying circuit 220 may sense and amplify the first divided clock signal CLK_DV1 loaded to the first setup node SN1 and the third divided clock signal CLK_DV3 loaded to the second setup node SN2 based on the positive clock signal CLK_R. That is, the node amplifying circuit 220 may sense and amplify signals loaded on the first setup node SN1 and the second setup node SN2 to output the amplified signals to the first latching node LN1 and the second latching node LN2. The fourth PMOS transistor PM4 may perform an initialization operation on the first latching node LN1 based on the positive clock signal CLK_R. The fifth PMOS transistor PM5 may perform an initialization operation on the second latching node LN2 based on the positive clock signal CLK_R.

The node reset circuit 230_1 and 230_2 may be configured to reset the second latching node LN2 of the node amplifying circuit 220 based on the reset control signal CTR_RST. The node reset circuit 230_1 and 230_2 may include a sixth PMOS transistor PM6 and a seventh PMOS transistor PM7.

The sixth PMOS transistor PM6 may be coupled between the power node, to which the supply power source VCCD is applied, and the first latching node LN1, through its source and drain. The sixth PMOS transistor PM6 may receive the supply power source VCCD at its gate. Therefore, the sixth PMOS transistor PM6 may be kept turned off based on the supply power source VCCD. The seventh PMOS transistor PM7 may be coupled between the power node, to which the supply power source VCCD is applied, and the second latching node LN2, through its source and drain. The seventh PMOS transistor PM7 may receive the reset control signal CTR_RST at its gate. Therefore, when the level of the reset control signal CTR_RST becomes a logic low, the seventh PMOS transistor PM7 may be turned on and may reset the second latching node LN2. The second latching node LN2 may correspond to the second setup node SN2, to which the third divided clock signal CLK_DV3 is loaded.

With such configuration, the seventh PMOS transistor PM7 of the node reset circuit 230_1 and 230_2 may perform a reset operation on the second latching node LN2 based on the reset control signal CTR_RST.

The signal output circuit 240 may be configured to generate the second divided clock signal CLK_DV2 and the fourth divided clock signal CLK_DV4 based on the first divided clock signal CLK_DV1 and the third divided clock signal CLK_DV3 amplified by the node amplifying circuit 220. The signal output circuit 240 may include first to fifth inverters INV1, INV2, INV3, INV4 and INV5, an eighth PMOS transistor PM8 and a sixth NMOS transistor NM6.

The first inverter INV1 may receive an output signal of the first latching node LN1, invert the received signal and output the inverted signal. The second inverter INV2 may receive the output signal of the first inverter INV1, invert the received signal and output the inverted signal. The third inverter INV3 may receive the output signal of the second latching node LN2, invert the received signal and output the inverted signal. The eighth PMOS transistor PM8 and the sixth NMOS transistor NM6 may be serially coupled between the power node, to which the supply power source VCCD is applied, and the power node, to which the ground power voltage VSS is applied. The eighth PMOS transistor PM8 may receive the output of the second inverter INV2 at its gate. The sixth NMOS transistor NM6 may receive the output signal of the third inverter INV3 at its gate. The fourth inverter INV4 may receive an output signal of a common node, at which the eighth PMOS transistor PM8 and the sixth NMOS transistor NM6 are interconnected, and may invert the received signal to generate the second divided clock signal CLK_DV2. The fifth inverter INV5 may receive the second divided clock signal CLK_DV2 output from the fourth inverter INV4 and may invert the received signal to generate the fourth divided clock signal CLK_DV4.

With such configuration, the signal output circuit 240 may generate the second divided clock signal CLK_DV2 and the fourth divided clock signal CLK_DV4 based on the first divided clock signal CLK_DV1 and the third divided clock signal CLK_DV3 amplified by the node amplifying circuit 220.

Figure 3:
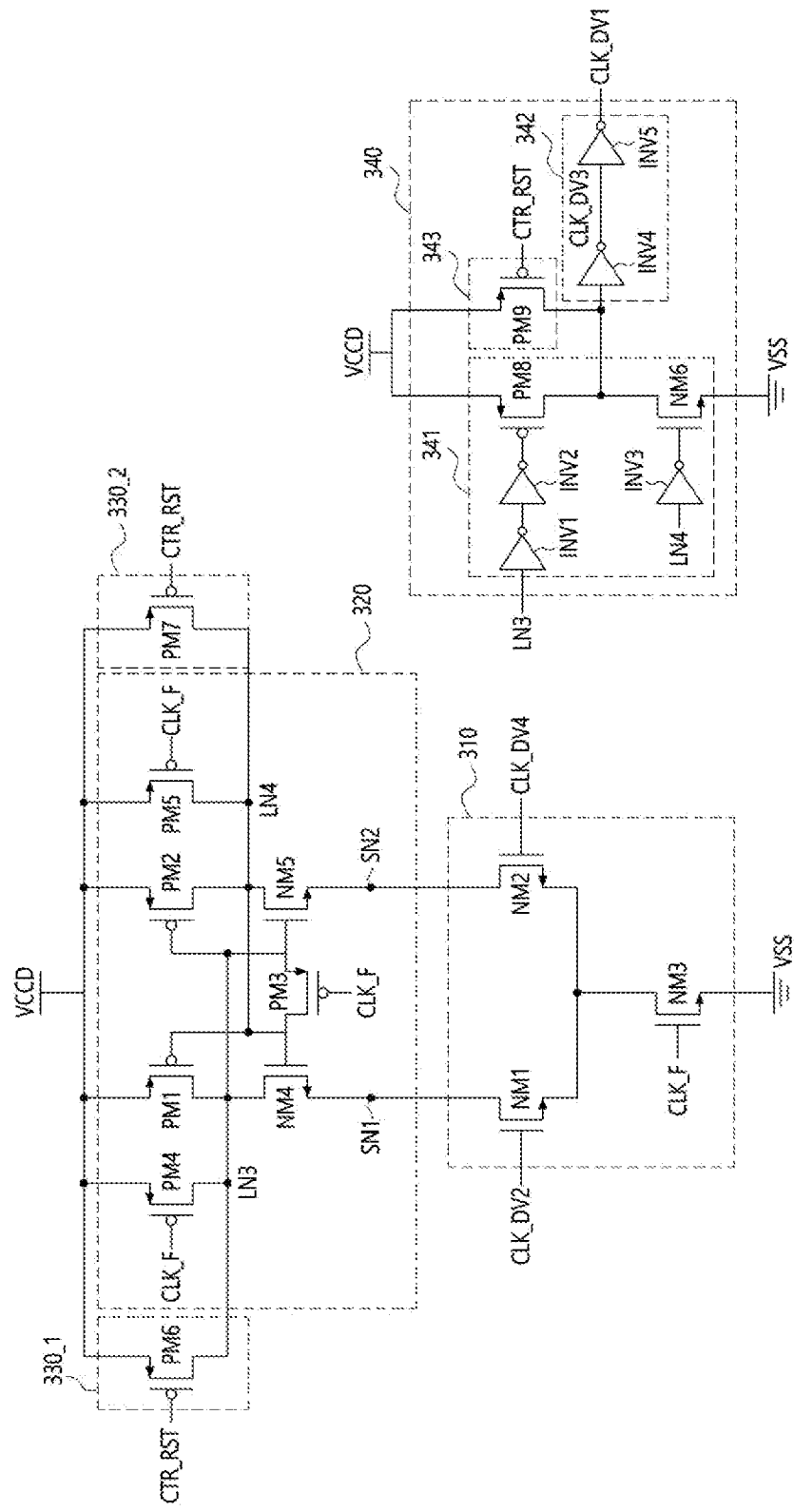
FIG. 3 is a circuit diagram illustrating a configuration of a second dividing circuit illustrated in FIG. 1.

FIG. 3 is a circuit diagram illustrating a configuration of the second dividing circuit 120 illustrated in FIG. 1.

Referring to FIG. 3, the second dividing circuit 120 may include a signal input circuit 310, a node amplifying circuit 320, a node reset circuit 330_1 and 330_2 and a signal output circuit 340.

The signal input circuit 310 may be configured to receive the second divided clock signal CLK_DV2 and the fourth divided clock signal CLK_DV4 and load the second divided clock signal CLK_DV2 and the fourth divided clock signal CLK_DV4 to setup nodes SN1 and SN2, respectively, based on the negative clock signal CLK_F. The signal input circuit 310 may have the same configuration as the signal input circuit 210 illustrated in FIG. 2 and therefore detailed description on the signal input circuit 310 will be omitted except that the signal input circuit 310 illustrated in FIG. 3 may receive the second divided clock signal CLK_DV2 instead of the first divided clock signal CLK_DV1 illustrated in FIG. 2 and may receive the fourth divided clock signal CLK_DV4 instead of the third divided clock signal CLK_DV3 illustrated in FIG. 2.

With such configuration, the signal input circuit 310 may load the second divided clock signal CLK_DV2 to the first setup node SN1 and may load the fourth divided clock signal CLK_DV4 to the second setup node SN2, based on the negative clock signal CLK_F.

The node amplifying circuit 320 may be configured to sense and amplify the second divided clock signal CLK_DV2 loaded to the first setup node SN1 and fourth divided clock signal CLK_DV4 loaded to the second setup node SN2 based on the negative clock signal CLK_F. The node amplifying circuit 320 may have the same configuration as the node amplifying circuit 220 illustrated in FIG. 2 and therefore detailed description on the node amplifying circuit 320 will be omitted except that the node amplifying circuit 320 illustrated in FIG. 3 may receive the negative clock signal CLK_F instead of the positive clock signal CLK_R illustrated in FIG. 2.

With such configuration, the node amplifying circuit 320 may sense and amplify the second divided clock signal CLK_DV2 loaded to the first setup node SN1 and the fourth divided clock signal CLK_DV4 loaded to the second setup node SN2 based on the negative clock signal CLK_F. That is, the node amplifying circuit 320 may sense and amplify signals loaded on the first setup node SN1 and the second setup node SN2 to output the amplified signals to a third latching node LN3 and a fourth latching node LN4. The third latching node LN3 may correspond to the first latching node LN1 illustrated in FIG. 2 and the fourth latching node LN4 may correspond to the second latching node LN2 illustrated in FIG. 2.

The node reset circuit 330_1 and 330_2 may be configured to reset the third latching node LN3 and the fourth latching node LN4 of the node amplifying circuit 320 based on the reset control signal CTR_RST. The node reset circuit 330_1 and 330_2 may have the same configuration as the node reset circuit 230_1 and 230_2 illustrated in FIG. 2 and therefore detailed description on the node reset circuit 330_1 and 330_2 will be omitted except that the node reset circuit 330_1 and 330_2 may receive the reset control signal CTR_RST instead of the supply power source VCCD illustrated in FIG. 2. That is, each of the sixth PMOS transistor PM6 and the seventh PMOS transistor PM7 of the node reset circuit 330_1 and 330_2 may receive the reset control signal CTR_RST at its gate. Therefore, when the level of the reset control signal CTR_RST becomes a logic low, the sixth PMOS transistor PM6 may turned on and may reset the third latching node LN3. Further, when the level of the reset control signal CTR_RST becomes a logic low, the seventh PMOS transistor PM7 may turned on and may reset the fourth latching node LN4. The third latching node LN3 may correspond to the first setup node SN1, to which the second divided clock signal CLK_DV2 is loaded. The fourth latching node LN4 may correspond to the second setup node SN2, to which the fourth divided clock signal CLK_DV4 is loaded.

With such configuration, the node reset circuit 330_1 and 330_2 may perform a reset operation on the third latching node LN3 and the fourth latching node LN4 based on the reset control signal CTR_RST.

The signal output circuit 340 may be configured to generate the first divided clock signal CLK_DV1 and the third divided clock signal CLK_DV3 based on the second divided clock signal CLK_DV2 and the fourth divided clock signal CLK_DV4 amplified by the node amplifying circuit 320. The signal output circuit 340 may include an input circuit 341, an output circuit 342 and a reset circuit 343.

The input circuit 341 may be configured to receive signals of the third latching node LN3 and the fourth latching node LN4. The input circuit 341 may include first to third inverters INV1, INV2 and INV3, an eighth PMOS transistor PM8 and a sixth NMOS transistor NM6.

The first inverter INV1 may receive an output signal of the third latching node LN3, invert the received signal and output the inverted signal. The second inverter INV2 may receive the output signal of the first inverter INV1, invert the received signal and output the inverted signal. The third inverter INV3 may receive an output signal of the fourth latching node LN4, invert the received signal and output the inverted signal. The eighth PMOS transistor PM8 and the sixth NMOS transistor NM6 may be serially coupled between the power node, to which the supply power source VCCD is applied, and the power node, to which the ground power voltage VSS is applied. The eighth PMOS transistor PM8 may receive the output of the second inverter INV2 at its gate. The sixth NMOS transistor NM6 may receive the output signal of the third inverter INV3 at its gate.

The output circuit 342 may be configured to receive the output signal of the input circuit 341 to output the first divided clock signal CLK_DV1 and the third divided clock signal CLK_DV3. The output circuit 342 may include a fourth inverter INV4 and a fifth inverter INV5.

The fourth inverter INV4 may receive an output signal of a common node, at which the eighth PMOS transistor PM8 and the sixth NMOS transistor NM6 are interconnected, and may invert the received signal to generate the third divided clock signal CLK_DV3. The fifth inverter INV5 may receive the third divided clock signal CLK_DV3 output from the fourth inverter INV4 and may invert the received signal to generate the first divided clock signal CLK_DV1.

The reset circuit 343 may be configured to perform a reset operation on the input node of the output circuit 342 based on the reset control signal CTR_RST. The reset circuit 343 may include a ninth PMOS transistor PM9.

The ninth PMOS transistor PM9 may be coupled between the power node, to which the supply power source VCCD is applied, and the input node of the output circuit 342, through its source and drain. The ninth PMOS transistor PM9 may receive the reset control signal CTR_RST at its gate. Therefore, when the level of the reset control signal CTR_RST becomes a logic low, the ninth PMOS transistor PM9 may be turned on and may reset the input node of the output circuit 342.

With such configuration, the signal output circuit 340 may generate the first divided clock signal CLK_DV1 and the third divided clock signal CLK_DV3 based on the second divided clock signal CLK_DV2 and the fourth divided clock signal CLK_DV4 amplified by the node amplifying circuit 320. The signal output circuit 340 may perform a reset operation on the first divided clock signal CLK_DV1 and the third divided clock signal CLK_DV3 based on the reset control signal CTR_RST.

Figure 4:
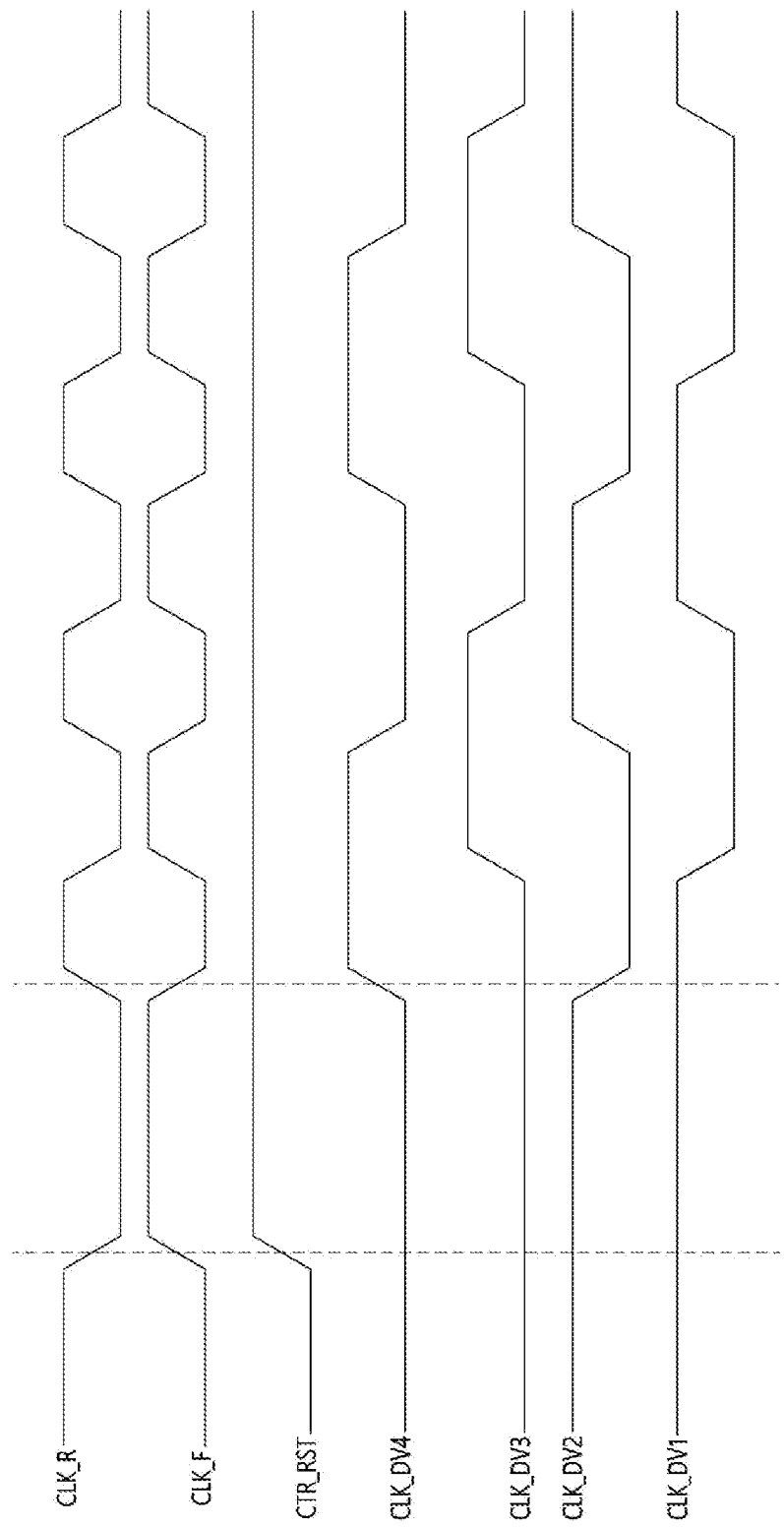
FIG. 4 is a timing diagram illustrating an operation timing of the dividing circuit system illustrated in FIGS. 1 to 3.

FIG. 4 is a timing diagram illustrating an operation timing of the dividing circuit system 100 illustrated in FIGS. 1 to 3. In FIG. 4, illustrated are the positive clock signal CLK_R, the negative clock signal CLK_F, the reset control signal CTR_RST and the first to fourth divided clock signals CLK_DV1, CLK_DV2, CLK_DV3 and CLK_DV4.

Referring to FIG. 4, when the level of the reset control signal CTR_RST becomes a logic low, the input node of the output circuit 342 illustrated in FIG. 3 may become reset. As the input node of the output circuit 342 is reset, the level of the third divided clock signal CLK_DV3 may become a logic low and the level of the first divided clock signal CLK_DV1 may become a logic high. At this time, the second to fourth latching nodes LN2, LN3 and LN4 may also become reset based on the reset control signal CTR_RST.

After the level of the reset control signal CTR_RST becomes a logic high, the level of the positive clock signal CLK_R may become a logic low and the level of the negative clock signal CLK_F may become a logic high. For convenience of description, defined as a preamble section is a time section while the level of the positive clock signal CLK_R keeps to a logic low and the level of the negative clock signal CLK_F keeps to a logic high. The positive clock signal CLK_R and the negative clock signal CLK_F may toggle by the internal clock generating circuit 130 illustrated in FIG. 1 after the preamble section. For convenience of description, defined as a toggling section is a time section when the positive clock signal CLK_R and the negative clock signal CLK_F toggle.

After the preamble section, the first dividing circuit 110 illustrated in FIG. 2 may perform a dividing operation based on a rising edge of the positive clock signal CLK_R. Specifically, the first NMOS transistor NM1 of the signal input circuit 210 may be turned on based on the first divided clock signal CLK_DV1, of which the level is a logic high. Therefore, the first setup node SN1 may have a voltage level corresponding to the ground power source VSS. After that, the node amplifying circuit 220 may amplify the first latching node LN1 to a logic low and the second latching node LN2 to a logic high, through a sense and amplifying operation. Therefore, the eighth PMOS transistor PM8 of the signal output circuit 240 may be turned on. Accordingly, the level of the second divided clock signal CLK_DV2 may transition to a logic low and the level of the fourth divided clock signal CLK_DV4 may transition to a logic high.

Subsequently, the second dividing circuit 120 illustrated in FIG. 3 may perform a dividing operation based on a rising edge of the negative clock signal CLK_F. The second dividing circuit 120 may perform the dividing operation in the similar way to the first dividing circuit 110 and therefore detailed description on the dividing operation of the second dividing circuit 120 will be omitted. The second dividing circuit 120 may receive the second divided clock signal CLK_DV2, of which the level is a logic low, and the fourth divided clock signal CLK_DV4, of which the level is a logic high. By the second dividing circuit 120, the level of the first divided clock signal CLK_DV1 may transition from a logic high to a logic low, and the level of the third divided clock signal CLK_DV3 may transition from a logic low to a logic high, based on a rising edge of the negative clock signal CLK_F.

Consequently, the first dividing circuit 110 may perform a reset operation based on the reset control signal CTR_RST to generate the second divided clock signal CLK_DV2 and the fourth divided clock signal CLK_DV4, which are divided from the positive clock signal CLK_R. Further, the second dividing circuit 120 may perform a reset operation based on the reset control signal CTR_RST to generate the first divided clock signal CLK_DV1 and the third divided clock signal CLK_DV3, which are divided from the negative clock signal CLK_F. The first to fourth divided clock signals CLK_DV1, CLK_DV2, CLK_DV3 and CLK_DV4 may sequentially have a phase difference, for example, by an amount of 90° with respect to the fourth divided clock signal CLK_DV4.

In each of the first dividing circuit 110 illustrated in FIG. 2 and the second dividing circuit 120 illustrated in FIG. 3, the first dividing circuit 110 and the second dividing circuit 120, being included in the dividing circuit system 100, may perform a reset operation based on the reset control signal CTR_RST. Within the first dividing circuit 110 illustrated in FIG. 2, the sixth PMOS transistor PM6 and the seventh PMOS transistor PM7 may perform reset operations in an asymmetrical way with respect to each other. The signal output circuit 240 illustrated in FIG. 2 and the signal output circuit 340 illustrated in FIG. 3 may perform reset operations in an asymmetrical way with respect to each other.

When the first divided clock signal CLK_DV1 and the third divided clock signal CLK_DV3 enter the preamble section and the toggling section without being reset, the first to fourth divided clock signals CLK_DV1, CLK_DV2, CLK_DV3 and CLK_DV4 may have non-sequential phases. Also, when a reset operation is performed on the first latching node LN1 and thus the voltage level of the first latching node LN1 rises, the first to fourth divided clock signals CLK_DV1, CLK_DV2, CLK_DV3 and CLK_DV4 may also have non-sequential phases.

However, the dividing circuit system 100 may perform a stable dividing operation through the asymmetrical reset operation in accordance with an embodiment of the present disclosure.

Figure 5:
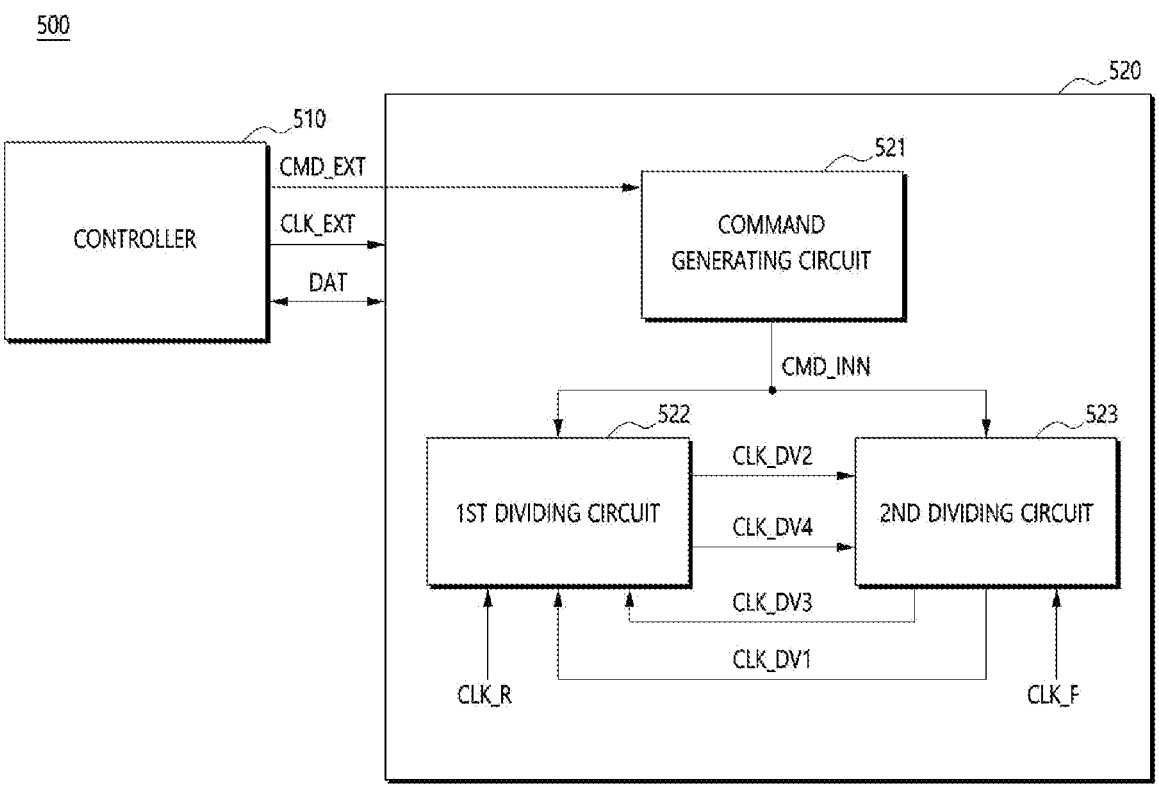
FIG. 5 is a block diagram illustrating a configuration of a semiconductor memory system in accordance with an embodiment.

FIG. 5 is a block diagram illustrating a configuration of a semiconductor memory system 500 in accordance with an embodiment.

Referring to FIG. 5, the semiconductor memory system 500 may include a controller 510 and a semiconductor memory apparatus 520. The semiconductor memory apparatus 520 may include a memory bank configured to store data DAT. The semiconductor memory apparatus 520 may perform a write operation of receiving data DAT to store the data DAT in the memory bank and may perform a read operation of outputting the data DAT stored in the memory bank.

The controller 510 may be configured to provide data DAT and an external command signal CMD_EXT corresponding to read and write operations. The controller 510 may provide the semiconductor memory apparatus 520 with an external clock signal CLK_EXT together with the external command signal CMD_EXT and the data DAT. The controller 510 may provide the chip enable signal described with reference to FIG. 1.

The semiconductor memory apparatus 520 may be configured to receive the external command signal CMD_EXT and the data DAT to perform write and read operations. The semiconductor memory apparatus 520 may include a command generating circuit 521, a first dividing circuit 522 and a second dividing circuit 523.

The command generating circuit 521 may be configured to generate an internal command signal CMD_INN based on the external command signal CMD_EXT. The internal command signal CMD_INN may be enabled when the semiconductor memory apparatus 520 performs read and write operations. The command generating circuit 521 may be implemented as a decoder. The internal command signal CMD_INN may be asynchronously generated. The internal command signal CMD_INN may correspond to the reset control signal CTR_RST described with reference to FIGS. 1 to 4.

The first dividing circuit 522 may be configured to perform a reset operation based on the internal command signal CMD_INN. The first dividing circuit 522 may be configured to generate the second divided clock signal CLK_DV2 and the fourth divided clock signal CLK_DV4, which are divided from the positive clock signal CLK_R, and which are based on the positive clock signal CLK_R, the first divided clock signal CLK_DV1 and the third divided clock signal CLK_DV3. The first dividing circuit 522 may correspond to the first dividing circuit 110 illustrated in FIG. 2.

The second dividing circuit 523 may be configured to perform a reset operation based on the internal command signal CMD_INN. The second dividing circuit 523 may be configured to generate the first divided clock signal CLK_DV1 and the third divided clock signal CLK_DV3, which are divided from the negative clock signal CLK_F, and which are based on the negative clock signal CLK_F, the second divided clock signal CLK_DV2 and the fourth divided clock signal CLK_DV4. The second dividing circuit 523 may correspond to the second dividing circuit 120 illustrated in FIG. 3.

In accordance with an embodiment of the present disclosure, the semiconductor memory system 500 may generate the internal command signal CMD_INN when performing write and read operations on the semiconductor memory apparatus 520. The semiconductor memory system 500 may perform the stable dividing operation through the reset operation based on the internal command signal CMD_INN. That is, during write and read operations, the semiconductor memory system 500 may generate the first to fourth divided clock signals CLK_DV1, CLK_DV2, CLK_DV3 and CLK_DV4 sequentially having a phase difference, for example, by an amount of 90°.

While certain embodiments have been described above, it will be understood to those skilled in the art that the embodiments described are by way of example only. Accordingly, the dividing circuit system and semiconductor memory system including thereof should not be limited based on the described embodiments. Rather, the dividing circuit system and semiconductor memory system including thereof described herein should only be limited in light of the claims that follow when taken in conjunction with the above description and accompanying drawings.

What is claimed is:

1. A dividing circuit system comprising:
a first dividing circuit configured to perform a reset operation based on a reset control signal and configured to generate a second divided clock signal and a fourth divided clock signal, which are divided from a positive clock signal, and which are based on the positive clock signal, a first divided clock signal and a third divided clock signal; and
a second dividing circuit configured to perform the reset operation based on the reset control signal and configured to generate the first divided clock signal and the third divided clock signal, which are divided from a negative clock signal, and which are based on the negative clock signal, the second divided clock signal and the fourth divided clock signal.

2. The dividing circuit system of claim 1, wherein the reset control signal is asynchronously generated.

3. The dividing circuit system of claim 1, wherein the reset control signal includes a chip enable signal.

4. The dividing circuit system of claim 1, wherein the first to fourth divided clock signals have different phases from one another.

5. The dividing circuit system of claim 1, further comprising an internal clock generating circuit configured to receive an external clock signal to generate the positive clock signal and the negative clock signal.

6. The dividing circuit system of claim 1, wherein the first dividing circuit includes:
a signal input circuit configured to receive the first divided clock signal and the third divided clock signal and load the first divided clock signal and the third divided clock signal respectively to setup nodes, based on the positive clock signal;
a node amplifying circuit configured to sense and amplify the first and third divided clock signals loaded to the setup nodes based on the positive clock signal;
a node reset circuit configured to reset a latching node of the node amplifying circuit based on the reset control signal; and
a signal output circuit configured to generate the second divided clock signal and the fourth divided clock signal based on the first and third divided clock signals amplified by the node amplifying circuit.

7. The dividing circuit system of claim 6, wherein the node reset circuit is configured to reset a latching node corresponding to the third divided clock signal based on the reset control signal.

8. The dividing circuit system of claim 1, wherein the second dividing circuit includes:
a signal input circuit configured to receive the second divided clock signal and the fourth divided clock signal and load the second divided clock signal and the fourth divided clock signal respectively to setup nodes, based on the negative clock signal;
a node amplifying circuit configured to sense and amplify the second and fourth divided clock signals loaded to the setup nodes based on the negative clock signal;
a node reset circuit configured to reset latching nodes of the node amplifying circuit based on the reset control signal; and
a signal output circuit configured to generate the first divided clock signal and the third divided clock signal based on the second and fourth divided clock signals amplified by the node amplifying circuit.

9. The dividing circuit system of claim 8, wherein the node reset circuit is configured to reset the latching nodes corresponding to the second divided clock signal and the fourth divided clock signal based on the reset control signal.

10. The dividing circuit system of claim 8, wherein the signal output circuit is configured to perform a reset operation on the first divided clock signal and the third divided clock signal based on the reset control signal.

11. The dividing circuit system of claim 8, wherein the signal output circuit includes:
an input circuit configured to receive signals of the latching nodes;
an output circuit configured to receive an output signal of the input circuit to output the first divided clock signal and the third divided clock signal; and
a reset circuit configured to perform a reset operation on an input node of the output circuit based on the reset control signal.

12. A semiconductor memory system comprising:
a controller configured to provide data and an external command signal corresponding to read and write operations; and
a semiconductor memory apparatus including:
a command generating circuit configured to generate an internal command signal based on the external command signal,
a first dividing circuit configured to perform a reset operation based on the internal command signal and configured to generate a second divided clock signal and a fourth divided clock signal, which are divided from a positive clock signal, and which are based on the positive clock signal, a first divided clock signal and a third divided clock signal, and
a second dividing circuit configured to perform the reset operation based on the internal command signal and configured to generate the first divided clock signal and the third divided clock signal, which are divided from a negative clock signal, and which are based on the negative clock signal, the second divided clock signal and the fourth divided clock signal.

13. The semiconductor memory system of claim 12, wherein the internal command signal is asynchronously generated.

14. The semiconductor memory system of claim 12, further comprising an internal clock generating circuit configured to receive an external clock signal to generate the positive clock signal and the negative clock signal.

15. The semiconductor memory system of claim 12, wherein the first dividing circuit includes:
a signal input circuit configured to receive the first divided clock signal and the third divided clock signal and load the first divided clock signal and the third divided clock signal respectively to setup nodes, based on the positive clock signal;
a node amplifying circuit configured to sense and amplify the first and third divided clock signals loaded to the setup nodes based on the positive clock signal;
a node reset circuit configured to reset a latching node of the node amplifying circuit based on the internal command signal; and
a signal output circuit configured to generate the second divided clock signal and the fourth divided clock signal based on the first and third divided clock signals amplified by the node amplifying circuit.

16. The semiconductor memory system of claim 15, wherein the node reset circuit is configured to reset a latching node corresponding to the third divided clock signal based on the internal command signal.

17. The semiconductor memory system of claim 12, wherein the second dividing circuit includes:
a signal input circuit configured to receive the second divided clock signal and the fourth divided clock signal and load the second divided clock signal and the fourth divided clock signal to setup nodes, based on the negative clock signal;
a node amplifying circuit configured to sense and amplify the second and fourth divided clock signals loaded to the setup nodes based on the negative clock signal;
a node reset circuit configured to reset latching nodes of the node amplifying circuit based on the internal command signal; and
a signal output circuit configured to generate the first divided clock signal and the third divided clock signal based on the second and fourth divided clock signals amplified by the node amplifying circuit.

18. The semiconductor memory system of claim 17, wherein the node reset circuit is configured to reset latching nodes corresponding to the second divided clock signal and the fourth divided clock signal based on the internal command signal.

19. The semiconductor memory system of claim 17, wherein the signal output circuit is configured to perform a reset operation on the first divided clock signal and the third divided clock signal based on the internal command signal.

20. The semiconductor memory system of claim 17, wherein the signal output circuit includes:
an input circuit configured to receive signals of the latching nodes;
an output circuit configured to receive an output signal of the input circuit to output the first divided clock signal and the third divided clock signal; and
a reset circuit configured to perform a reset operation on an input node of the output circuit based on the internal command signal.

* * * * *